United States Patent
Van Roon et al.

(10) Patent No.: US 10,681,827 B2
(45) Date of Patent: Jun. 9, 2020

(54) SECURING A PCB IN A PLASTIC AND METAL HOUSING

(71) Applicant: Flextronics AP, LLC, San Jose, CA (US)

(72) Inventors: Darren Van Roon, Bowmanville (CA); Gary Warren, Aurora (CA); Steven Steane, Courtice (CA)

(73) Assignee: FLEXTRONICS AP, LLC, San Jose, CA (US)

( * ) Notice: Subject to any disclaimer, the term of this patent is extended or adjusted under 35 U.S.C. 154(b) by 0 days.

(21) Appl. No.: 16/262,206

(22) Filed: Jan. 30, 2019

(65) Prior Publication Data

US 2019/0166702 A1 May 30, 2019

Related U.S. Application Data

(63) Continuation of application No. 15/681,016, filed on Aug. 18, 2017, now Pat. No. 10,206,295.
(Continued)

(51) Int. Cl.
*H05K 5/00* (2006.01)
*H05K 7/14* (2006.01)
(Continued)

(52) U.S. Cl.
CPC ............ *H05K 5/006* (2013.01); *H05K 5/003* (2013.01); *H05K 5/0013* (2013.01);
(Continued)

(58) Field of Classification Search
CPC ...... H05K 5/006; H05K 5/0013; H05K 5/003; H05K 5/0034; H05K 5/0052;
(Continued)

(56) References Cited

U.S. PATENT DOCUMENTS

| 4,696,526 A | 9/1987 | Newton et al. |
| 5,673,181 A | 9/1997 | Hsu |

(Continued)

FOREIGN PATENT DOCUMENTS

| DE | 102008040156 A1 | 1/2010 |
| DE | 102011056082 A1 | 6/2013 |

(Continued)

OTHER PUBLICATIONS

International Search Report for WO Application PCT/US2017/047832 dated Aug. 21, 2017.

*Primary Examiner* — Travis S Chambers
(74) *Attorney, Agent, or Firm* — Volpe and Koenig, P.C.

(57) ABSTRACT

Described herein is a system and method for securing a printed circuit board without the use of screws in a housing assembly comprising a bottom housing made of plastic and a top housing made of metal. The top housing comprises a plurality of ribs. The bottom housing comprises a plurality of flexible snap arms each having a head portion, which includes an angled lower face, a horizontal crush rib, and a vertical crush rib. Upon coupling of the assembly, the ribs exert a horizontal force on the flexible snap arms resulting in climbing of the angled lower face further onto the printed circuit board. The horizontal force may also crush the horizontal crush ribs allowing for increased flexibility between the components to adjust for interference, preventing potential damage to the printed circuit board. Vertical forces may also crush the vertical crush ribs allowing for increased flexibility between the components.

20 Claims, 9 Drawing Sheets

Related U.S. Application Data

(60) Provisional application No. 62/377,330, filed on Aug. 19, 2016.

(51) Int. Cl.
    *H05K 5/02*         (2006.01)
    *H05K 5/03*         (2006.01)
    *H05K 5/06*         (2006.01)

(52) U.S. Cl.
CPC ......... *H05K 5/0034* (2013.01); *H05K 5/0052* (2013.01); *H05K 5/0056* (2013.01); *H05K 5/0221* (2013.01); *H05K 5/03* (2013.01); *H05K 5/069* (2013.01); *H05K 7/142* (2013.01)

(58) Field of Classification Search
CPC ...... H05K 5/0056; H05K 5/0221; H05K 5/03; H05K 5/069; H05K 7/142
USPC ........ 439/76.1, 892, 607.47, 620.21, 620.22, 439/686
See application file for complete search history.

(56) References Cited

U.S. PATENT DOCUMENTS

| | | | |
|---|---|---|---|
| 6,332,784 B1* | 12/2001 | Oliphant | H01R 31/065 361/679.4 |
| 8,480,186 B2 | 7/2013 | Wang | |
| 9,468,110 B2 | 10/2016 | Nagahama | |
| 10,206,295 B2* | 2/2019 | Van Roon | H05K 5/003 |
| 2002/0136586 A1 | 9/2002 | Ansell et al. | |
| 2013/0170160 A1* | 7/2013 | Sano | H05K 5/0221 361/756 |
| 2015/0201505 A1* | 7/2015 | Hu | H05K 5/0013 312/223.1 |

FOREIGN PATENT DOCUMENTS

| | | |
|---|---|---|
| EP | 1130879 A1 | 9/2001 |
| WO | 2006105746 A2 | 10/2006 |
| WO | 2015100921 A1 | 7/2015 |

* cited by examiner

SECURING A PCB IN A PLASTIC AND METAL HOUSING

CROSS REFERENCE TO RELATED APPLICATION

This application is a continuation application, and claims the benefit of U.S. Non-Provisional application Ser. No. 15/681,016 filed on Aug. 18, 2017 (now U.S. Pat. No. 10,206,295 B2, issued Feb. 12, 2019), which claims the benefit of Provisional Application No. 62/377,330 filed on Aug. 19, 2016. All of the foregoing are incorporated by reference herein as if fully set forth.

FIELD OF INVENTION

This invention relates to a plastic and metal housing for securing a printed circuit board.

BACKGROUND

When securing a printed circuit board in a housing there is a variation, or tolerance, of the board thickness of the printed circuit board, the top and bottom housing snap features, and the top and bottom housing printed circuit board support features. These tolerances need to be compensated for to ensure that the printed circuit board is held securely, and is prevented from movement or vibration. In order to compensate for the above-referenced tolerances, crush ribs (or crumple zones), are typically used on either the top or bottom housing in an assembly not using screws.

In the case of some printed circuit board modules, there are connectors associated with the printed circuit board module that need to be located at a precise height. Because crush ribs are crushed, or compressed, upon assembly of the top and bottom housing, the crush ribs cannot be located on the housing component located on the same side of the housing assembly as the connectors because the height of the connectors will vary depending upon the degree of crushing of the crush ribs. This amount of variance would not allow for the height of the connectors to be maintained. In order to achieve a precise height of the connectors upon assembly of the printed circuit board housing, a hard strut is needed to control the height, and the crush ribs would have to be positioned on the housing component opposite that of the one located on the same side as the connectors, which in this instance would be the top housing.

In the case of some printed circuit boards, there are also temperature issues, wherein the top housing heats up. In order to dissipate this excess heat away and expel it into the air, a heat conductive paste or pad can be used to make a thermal connection with the top housing to try and draw the heat away. Because the heat conductive properties of plastic are not as good as those of metal, a plastic housing cannot be used in situations where the top housing of a printed circuit board heats up beyond an acceptable amount. In these situations, a metal housing cover is preferred to better dissipate the excess heat.

However, if the connectors are associated with the bottom housing component and the opposing top housing component is made of metal, the crush ribs could not be located on the bottom housing or the top metal housing because the height of the connectors could vary upon assembly if the crush ribs were located on the bottom housing as described above, and the crush ribs would not "crush" and only dig into the printed circuit board if they were located on the top metal housing.

Accordingly it is desirable for crush ribs to be located on the side of the printed circuit board assembly having a top portion that is metal, wherein the crush ribs are still "crushable."

SUMMARY

In an aspect, the invention relates to a system and method for securing a printed circuit board, comprising a bottom housing component formed of plastic and a top housing component formed of metal. The top housing component comprises a plurality of ribs and the bottom housing component comprises a plurality of flexible snap arms each having a bottom body portion and a top head portion, which extends over the plane of the printed circuit board. The head portion of each flexible snap arm comprises a horizontal crush rib, a vertical crush rib, and an angled lower face.

Upon coupling of the bottom housing component with the top housing component the ribs exert a horizontal force on the flexible snap arms resulting in climbing of the angled lower face further onto a top surface of the printed circuit board. This horizontal force may also "crush" the horizontal crush ribs allowing for increased flexibility between the components to adjust for interference, preventing potential damage to the printed circuit board. Vertical forces may also "crush" the vertical crush ribs allowing for increased flexibility between the component and protection to prevent components from twisting or breaking.

Each of these forces, either alone or in combination, help secure the printed circuit board firmly within the housing assembly while also providing enough flexibility to compensate for variations in size of the housing components and printed circuit board to ensure a vibration free assembly. In addition, the presence of the flexible snap arms may act as an intermediary between the metal housing and the printed circuit board, allowing the plastic to act as an insulator, preventing the metal from touching the printed circuit board itself.

The housing assembly disclosed herein does not require the use of screws, allowing for ease of assembly. Benefits of this may include faster production time and decreased costs with regard to materials and labor.

BRIEF DESCRIPTION OF THE DRAWINGS

A more detailed understanding may be had from the following description, given by way of example in conjunction with the accompanying drawings wherein.

DETAILED DESCRIPTION OF THE PREFERRED EMBODIMENTS

Figure 1A:
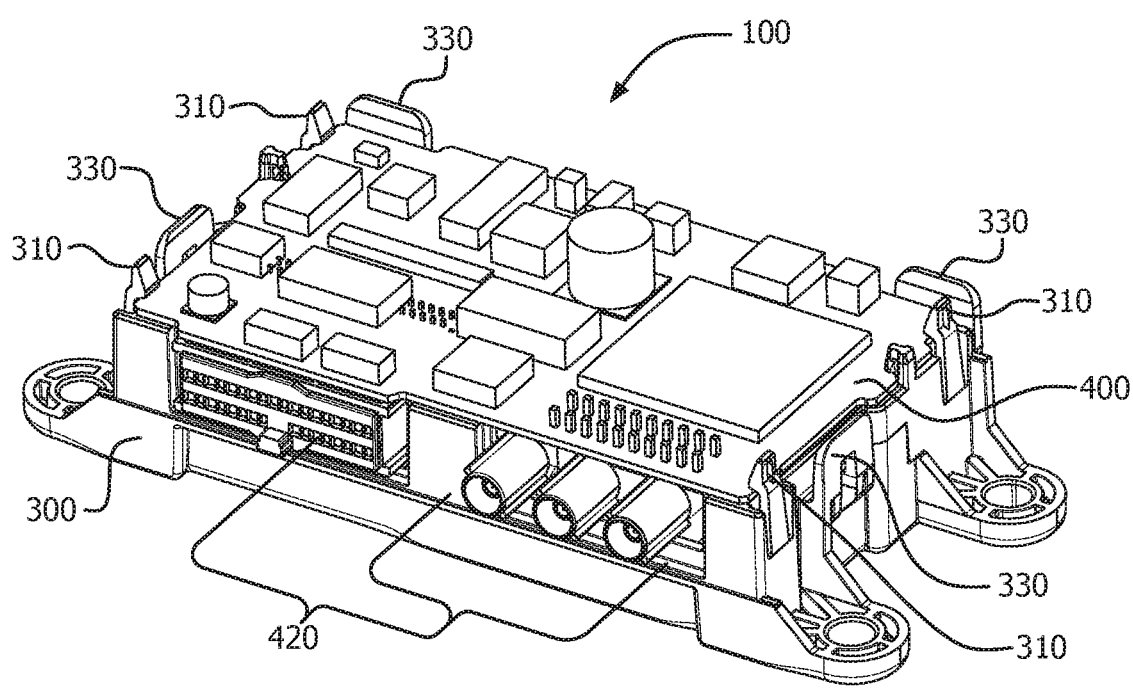
FIG. 1A is a perspective view of the housing assembly for securing a printed circuit board, including a bottom housing component assembled with printed circuit board. The top housing component is not included.
Figure 1B:
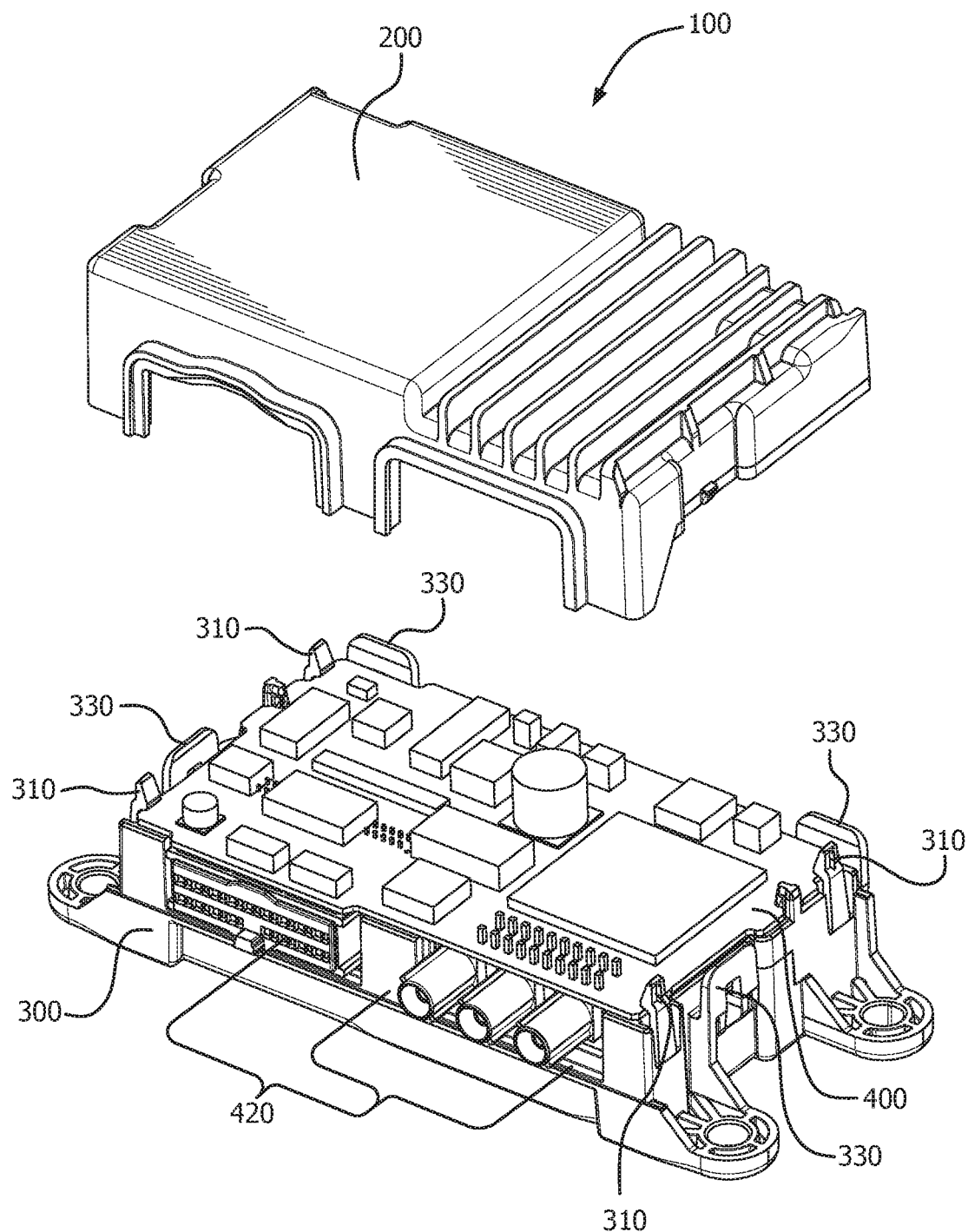
FIG. 1B is a perspective view of the housing assembly for securing a printed circuit board, including a bottom housing component assembled with printed circuit board, and a top housing component positioned above in the unassembled state.

FIGS. 1A and 1B illustrate a perspective view of the housing assembly for securing a printed circuit board 100 in the unassembled state. The printed circuit board 100 is assembled with the bottom housing component 300. The top housing component 200 is not assembled with the bottom housing component 300 or printed circuit board 400.

The bottom housing component 300 is formed from a plastic material. Non-limiting examples may include materials such as polypropylene, nylon, and polycarbonate. In an exemplary embodiment, the bottom housing component 300 is formed from a softer material, such as polypropylene.

The bottom housing component 300 comprises a plurality of flexible snap arms 310 located on the sides of the bottom housing component 300 extending upward above the plane of the printed circuit board 400. In an embodiment, there may be one flexible snap arm 310 located on a side wall of the bottom housing component 300 and another flexible snap arm 310 located on an opposing side wall of the bottom housing component 300. In another embodiment, a plurality of flexible snap arms 310 may be located on a side wall of the bottom housing component 300 and a plurality of flexible snap arms 310 may be located on an opposing side wall of the bottom housing component 300. In another embodiment, all four side walls of the bottom housing component 300 comprise at least one flexible snap arm 310 on each side wall. In the instance where a plurality of flexible snap arms 310 are located on a given side wall, the distance between each flexible snap arm 310 may be the same or may vary.

In an exemplary embodiment, two flexible snap arms 310 may be located on a side wall of the bottom housing component 300 and two flexible snap arms 310 may be located on an opposing side wall of the bottom housing component 300. Each of the flexible snap arms 310 located on a given side wall is paired directly opposite a corresponding flexible snap arm 310 on the opposing side wall.

Figure 1C:
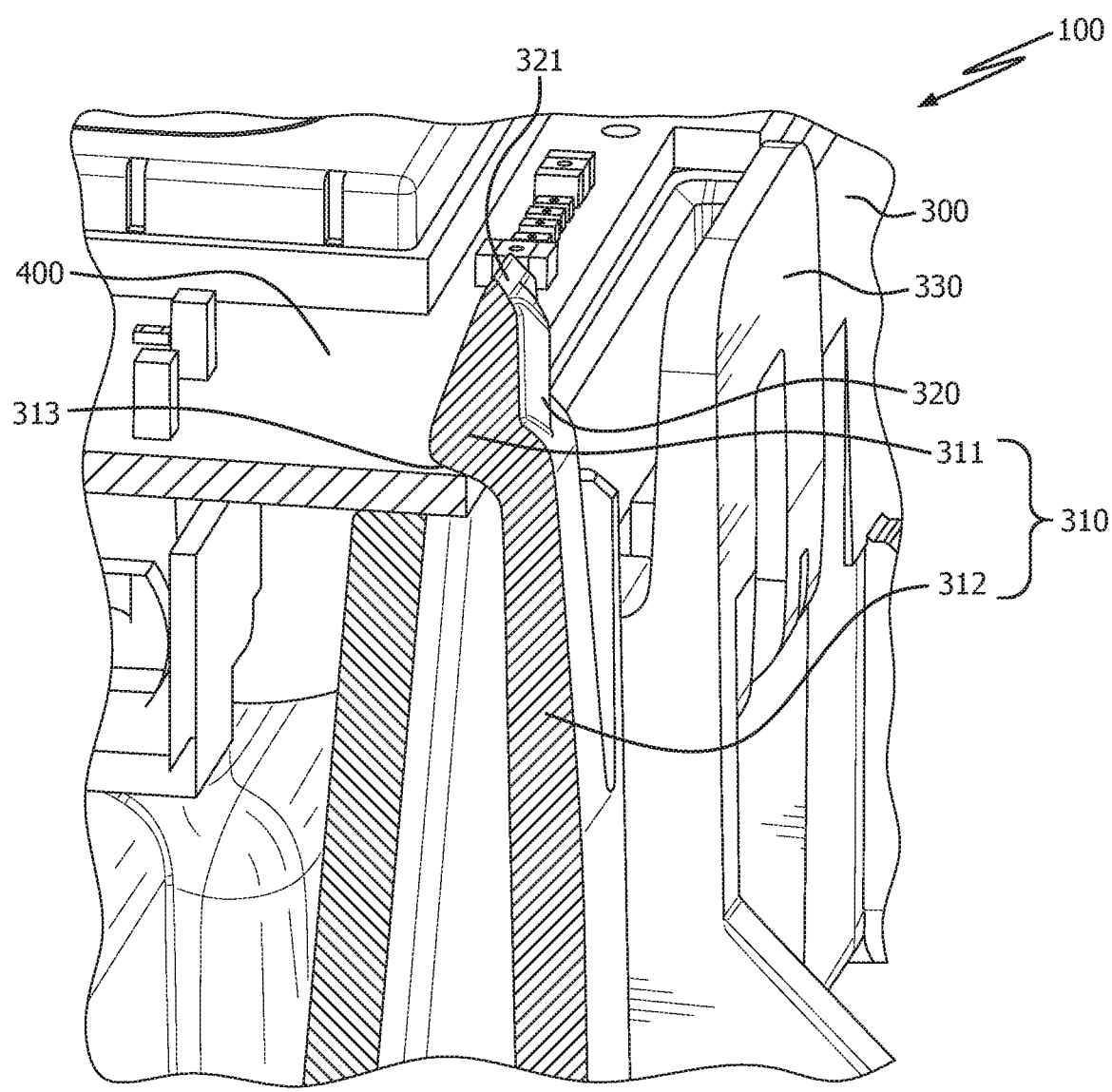
FIG. 1C is an enlarged view of a portion of the housing assembly for securing a printed circuit board of FIG. 1A, including the bottom housing component and printed circuit board, but not the top housing component.

FIG. 1C illustrates an enlarged view of the bottom housing component 300 including a printed circuit board 400 within. The top housing component 200 is not included. A magnified view of a flexible snap arm 310 located on the bottom housing component 300 can be seen. When a printed circuit board 400 is contained within the housing assembly 100, each flexible snap arm 310 extends from below the plane of the printed circuit board 400 to above the plane of the printed circuit board 400.

The flexible snap arms 310 are made of the same material used to make the bottom housing component. Non-limiting examples may include materials such as polypropylene, nylon, and polycarbonate. In an exemplary embodiment, the flexible snap arms 310 are formed from a softer material, such as polypropylene.

Although there are not necessarily any distinct boundaries between a top portion of the flexible snap arm 310 and a bottom portion of the flexible snap arm 310, the top portion can be considered the head portion 311 of the flexible snap arm 310 and the bottom portion can be considered the body portion 312 of the flexible snap arm 310. In an embodiment, the head portion 311 comprises the portion of the flexible snap arm 310 above a lowest point of an angled lower face 313, described below, and the body portion 312 comprises the portion of the flexible snap arm 310 below the lowest point of the angled lower face 313. In an embodiment, the flexible portion of the flexible snap arm 310 is the portion below the level of the printed circuit board 400 comprising the body portion 312.

In an exemplary embodiment, the head portion 311 of each flexible snap arm 310 includes at least a horizontal crush rib 320, a vertical crush rib 321, and the angled lower face 313. Each horizontal crush rib 320 is located on an exterior facing surface of each respective flexible snap arm 310 and runs vertically along a portion of the exterior facing surface of the head portion 311. In an exemplary embodiment, a single horizontal crush rib 320 is located on the exterior facing surface of each respective flexible snap arm 310.

In another embodiment, a plurality of horizontal crush ribs 320 is located on the exterior facing surface of each respective flexible snap arm 310. The plurality of horizontal crush ribs 320 may be lined up with one another, running in parallel. In an embodiment, each of the horizontal crush ribs 320 runs vertically along a portion of the exterior facing surface of the head portion 311 of each flexible snap arm 310. In another embodiment, each of the horizontal crush ribs 320 runs horizontally along a portion of the exterior facing surface of the head portion 311 of each flexible snap arm 310.

Each horizontal crush rib 320 is formed from a material that is configured to crush when a force is exerted upon it. In an exemplary embodiment, each horizontal crush rib 320 is formed from the same material used to make the bottom housing component. This crushing of the horizontal crush ribs 320 allows for extra interference to be designed into the housing assembly taking advantage of the flexible material that the crush ribs 320.

Each vertical crush rib 321 is located on a top surface of each respective flexible snap arm 310 and runs along the head portion 311 in the longitudinal direction. In an exemplary embodiment, a single vertical crush rib 321 is located on the top surface of each respective flexible snap arm 310.

In other embodiments, a plurality of vertical crush ribs 321 is located on the top surface of each respective flexible snap arm 310. The plurality of vertical crush ribs 321 may be lined up with one another, running in parallel. In an embodiment, each of the vertical crush ribs 321 runs along the head portion 311 of each flexible snap arm 310 in the longitudinal direction. In another embodiment, each of the vertical crush ribs 321 runs along the head portion 311 of each flexible snap arm 310 perpendicular to the longitudinal direction.

Each vertical crush rib is formed from a material that is configured to crush when a force is exerted upon it. In an exemplary embodiment, each vertical crush rib 321 is formed from the same material used to make the bottom housing component. This crushing of the vertical crush ribs 321 helps to secure the printed circuit board within the housing assembly when the top housing component couples with the bottom housing component, adding strength to the assembly and preventing any failure of the flexible snap arm 310 due to vertical forces from lower connector 420 insertion forces.

This crushing of both the horizontal crush ribs 320 and the vertical crush ribs 321 also allows for extra interference to be designed into the housing assembly taking advantage of the flexible material that the crush ribs 320, 321 are made of. The extra interference provided by the crush ribs 320, 321 are from "crushing" by the force(s) being exerted upon them.

With regard to the location of the crush ribs 320, 321, they do not make direct contact with the printed circuit board 400 in the housing assembly disclosed herein. This is advantageous in part because crush ribs in general can have a sharp edge, which may dig into the printed circuit board 400 with a potentially damaging force if they were to have direct contact with it. Having the crush ribs 320, 321 facing the side walls and top surface of the top housing component 200, respectively, helps to prevent this particular damage from occurring to the printed circuit board 400.

With regard to the shape of the horizontal crush ribs 320, as referenced by the longitudinal edge that protrudes outward, running parallel to the longitudinal axis of the flexible snap arm 310, it may be triangular, circular, or other so long as the crush rib remains compressible upon exertion of a horizontal force upon it. In an exemplary embodiment, the shape of the horizontal crush rib is triangular.

With regard to the shape of the vertical crush rib, as referenced by the longitudinal edge that protrudes outward running along the top surface of the flexible snap arm 310, it may be triangular, circular, or other so long as the crush rib remains compressible upon exertion of a vertical force upon it. In an exemplary embodiment, the shape of the vertical crush rib is triangular.

With regard to the size of the crush ribs 320, 321, this may also vary and be adjusted to achieve a desired compression, or "crushing". Varying the size of the crush ribs 320, 321 may allow for a desired interference to be achieved between the housing components 200, 300 and the printed circuit board upon assembly. This may also minimize the effects on compensation as a result of variation in size of any of these components of the housing assembly 100.

The angled lower face 313 of each respective flexible snap arm 310 is located on a bottom surface of the head portion 311. A lowest portion of the angled lower face 313 is positioned proximal to the body portion 312 of each respective flexible snap arm 310 and a highest portion of the angled lower face 313 is positioned distal to the body portion 312 of each respective flexible snap arm 310.

When the printed circuit board 400 is positioned within the bottom housing component 300, the angled lower face 313 contacts a top surface of the printed circuit board 400. In an exemplary embodiment, the point of contact of the printed circuit board 400 with the angled lower face 313 is the edge of the printed circuit board 400.

When the top housing component 200 is coupled with the bottom housing component 300 including the printed circuit board 400, the angled lower face 313 climbs further onto the top surface of the printed circuit board 400. The coupling of the top housing component 200 exerts an inward force on the flexible snap arm 310, and a subsequent downward force on the angled lower face 313 causing it to travel further past the edge of the printed circuit board 400.

In an embodiment, the top housing component 200 formed of a metal does not make direct contact with the printed circuit board 400. In essence the plastic may be used as an insulator for the printed circuit board 400.

The bottom housing component 300 may further include snap arms 330 located on a side wall of the bottom housing component 300. Each snap arm 330 extends vertically along the side wall. In an embodiment the snap arm 330 may extend vertically past the plane of a printed circuit board 400 when placed in the bottom housing component 300. The snap arms may be formed of a plastic material. Non-limiting examples include materials such as polypropylene, nylon, and polycarbonate. In an exemplary embodiment, the snap arms 330 are made of the same material as the bottom housing component 300.

In an exemplary embodiment, there may be a single snap arm 330 located on each side wall of the bottom housing component 300. In another embodiment, a plurality of snap arms 300 may be located on each side wall of the bottom housing component 300. In yet another embodiment a single snap arm 300 may be located on a side wall and another single snap arm 330 located on an opposing side wall. Further a plurality of snap arms 330 may be located on opposing side walls only. In certain embodiments, the number of snap arms 330 located on one side wall of the bottom housing component 300 either matches or does not match the number of snap arms 330 located on the other side walls of the bottom housing component 300.

Figure 2:
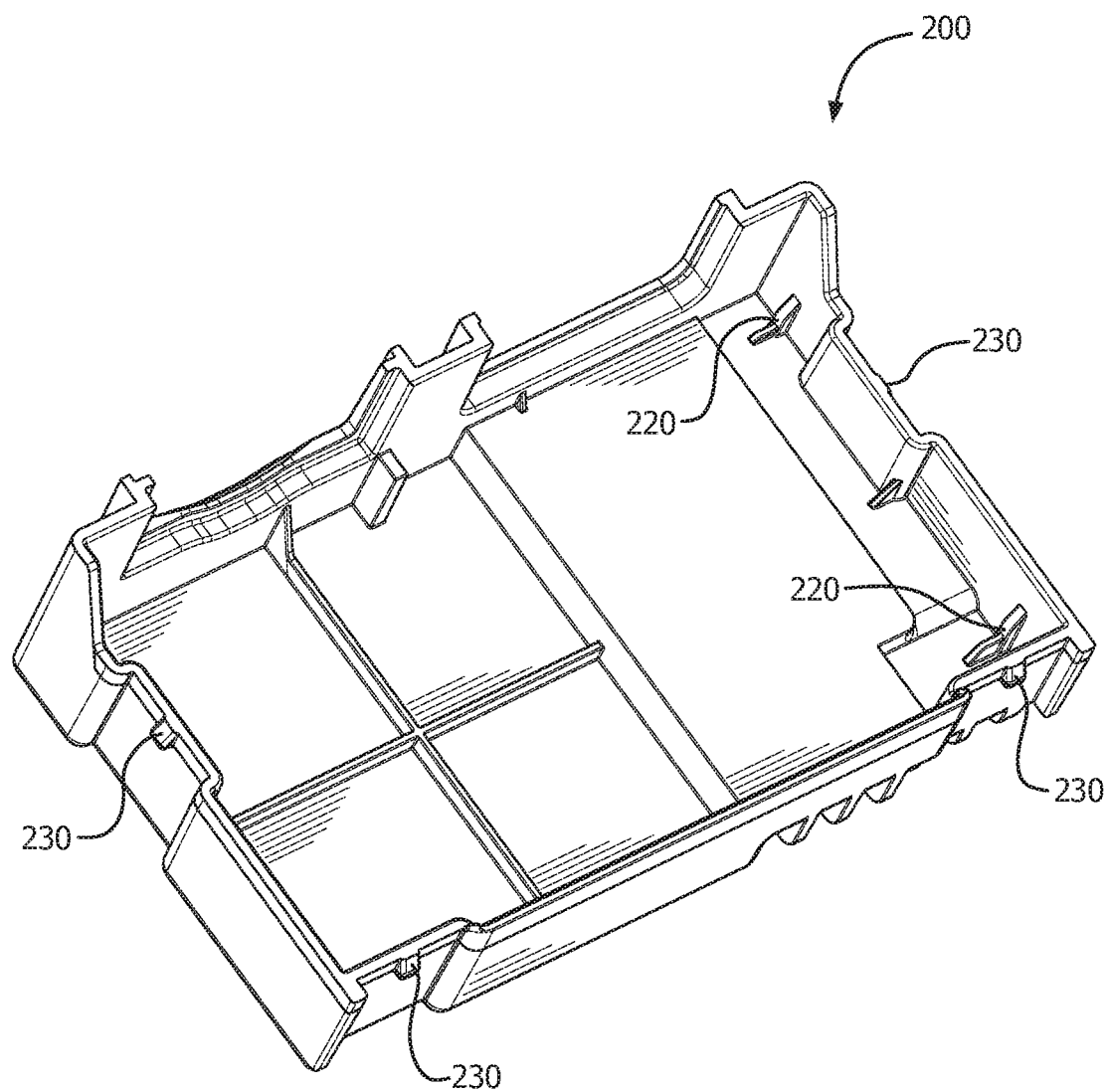
FIG. 2 is a perspective view of a top housing component of the housing assembly for securing a printed circuit board.

The snap arms 330 are configured to engage with a corresponding hook 230 located on the top housing component 200, as illustrated in FIG. 2. Each hook 230 is located on an exterior surface of a side wall of the top housing component 200, oriented to couple with a corresponding snap arm 330. The configuration of the snap arms may be as described in the foregoing for snap arms 330. In an exemplary embodiment, each snap arm 330 is paired with a corresponding hook 230 upon assembly of the housing components 200, 300. In other embodiments, only some of the hooks 230 are paired with a corresponding snap arm 330 upon assembly of the housing components 200, 300.

The hooks 230 may be made of a metal material. Non-limiting examples may include materials such as aluminum, magnesium, and steel. In an exemplary embodiment, the hooks 230 are formed from the same material used to form the top housing component 200.

FIG. 2 illustrates a perspective view of the top housing component 200. The top housing component 200 is made of a metal material. Non-limiting examples may include materials such as aluminum, magnesium, and steel.

In an embodiment, the top housing component 200 further comprises a plurality of ribs 220 located on an inner surface of the side walls of the top housing component 200 extending vertically from an inner top surface at its proximal end, along at least a portion of the inner surface of the side wall, and terminating at its distal end at or before the bottom surface of the side walls. Each rib 220 may also continue to extend along a top surface of the top housing component 200 as illustrated in at least FIG. 2.

The ribs 220 are formed from a metal material. Non-limiting examples may include materials such as aluminum, magnesium, and steel. In an exemplary embodiment, the ribs 220 may be formed from the same material as the top housing component 200. In an embodiment, the ribs 220 may be formed from a different material than the top housing component 200.

In an embodiment, there may be one rib 220 located on an inner surface side wall of the top housing component 200 and another rib 220 located on an opposing inner surface side wall of the top housing component 200. In another embodiment, a plurality of ribs 220 may be located on an inner surface side wall of the top housing component 200 and a plurality of ribs 220 may be located on an opposing inner surface side wall of the top housing component 200, wherein the number of ribs 220 located on one inner surface side wall of the top housing component 200 either matches or does not match the number of ribs 220 located on the opposing inner surface side wall of the top housing component 200. In another embodiment, all four inner surface side walls of the top housing component 200 comprise at least one rib 220 on each side wall. Wherein a plurality of ribs 220 is located on a given inner surface side wall the distance between each rib 220 may be the same or may vary. In each of these embodiments, each rib 220 may also continue to extend along the top surface of the top housing component 200.

In an exemplary embodiment, two ribs 220 may be located on an inner surface side wall of the top housing component 200 and two ribs 220 may be located on an opposing inner surface side wall of the top housing component 200. Each of the ribs 220 located on a given inner surface side wall is paired directly opposite a corresponding rib 220 on the opposing inner surface side wall. In an embodiment, each rib 220 may also continue to extend along the top surface of the top housing component 200.

In an exemplary embodiment, each flexible snap arm 310 is paired with a corresponding rib 220 upon assembly of the housing components 200, 300. In an embodiment, each rib 220 is paired with a corresponding flexible snap arm 310 upon assembly of the housing components 200, 300.

Figure 3A:
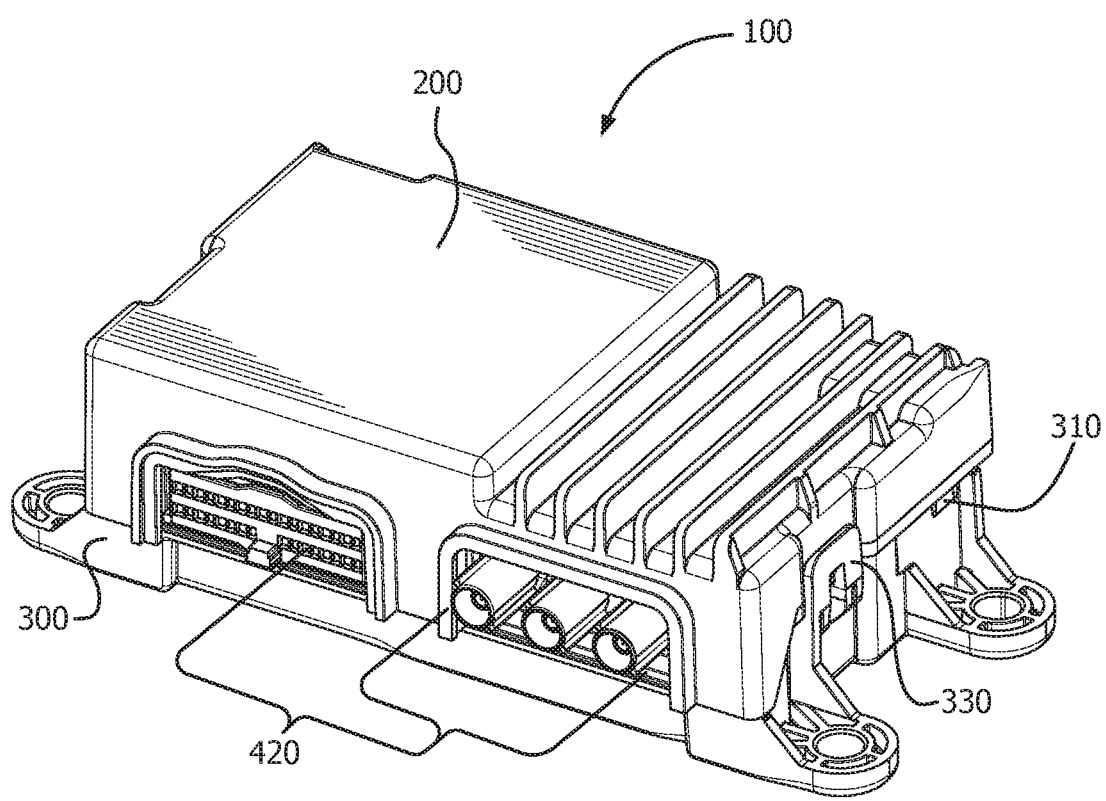
FIG. 3A is a perspective view of the housing assembly for securing a printed circuit board, including the bottom housing component, the top housing component, and the printed circuit board in the assembled state.

FIG. 3A illustrates the housing assembly 100 in the assembled state. A top housing component 200 is coupled with a bottom housing component 300, wherein at least a snap arm 330 is shown, and is engaged with a corresponding hook 230 (not shown). What cannot be seen are at least the printed circuit board 400, the ribs 220, the flexible snap arms 310, the horizontal crush ribs 320, the vertical crush ribs 321, and the angled lower face 313 of the flexible snap arms 310.

Figure 3B:
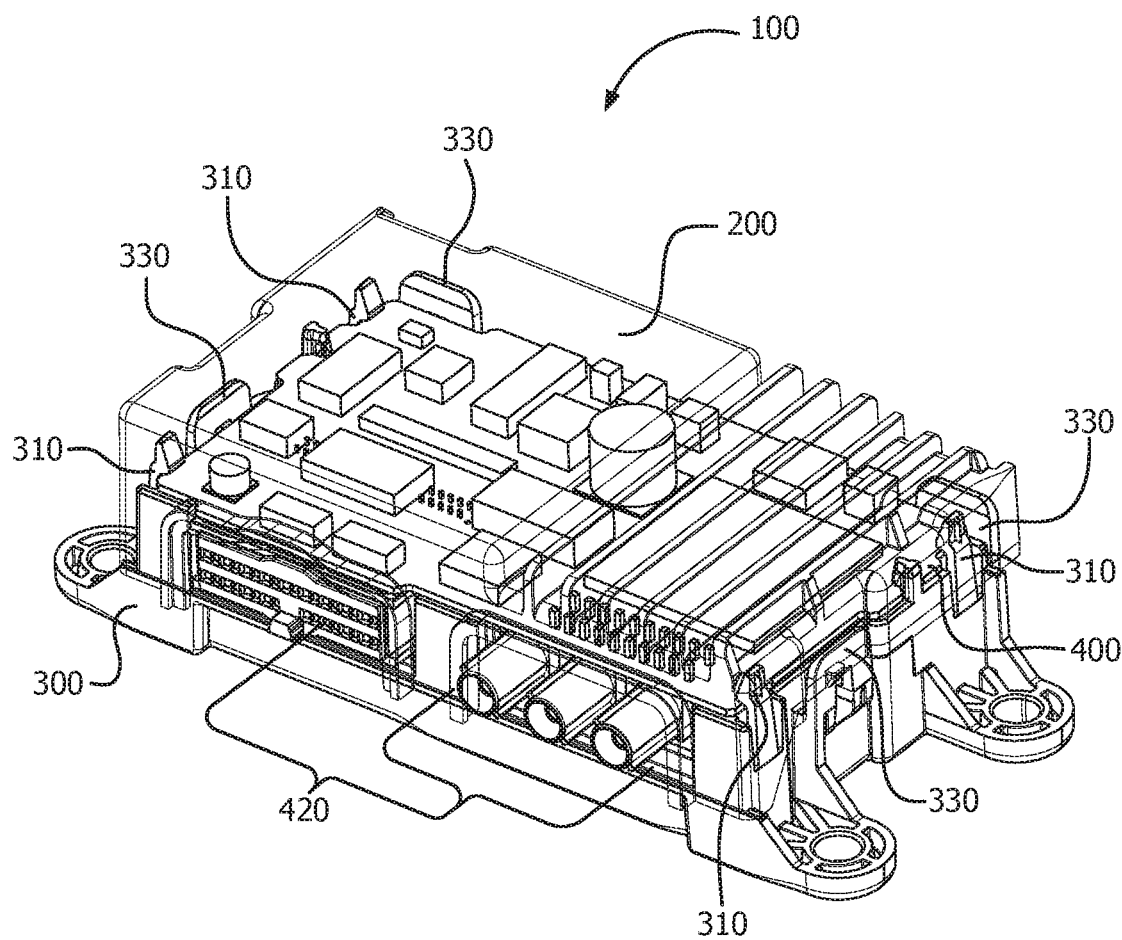
FIG. 3B is a perspective view of the housing assembly for securing a printed circuit board, including the bottom housing component, the top housing component, and the printed circuit board in the assembled state, with the top housing component shown as a transparent component for illustrative purposes.

FIG. 3B illustrates an embodiment of the housing assembly 100 in the assembled state whereby the top housing component is shown as a transparent component for illustrative purposes only. This embodiment of the housing assembly 100 illustrates not only the top housing component 200, bottom housing component 300, printed circuit board 400, and snap arms 330, but also the printed circuit board 400, and the flexible snap arms 310. In an embodiment, a plurality of ribs 220 may also be present along the inner surfaces of the top housing component 200.

In an embodiment, upon coupling of the housing components 200, 300 with one another and the printed circuit board 400, the ribs 220 exert a horizontal force on the horizontal crush ribs and on a head portion 311 of the flexible snap arm 310 causing the angled lower face portion of the head portion 311 to climb further onto the printed circuit board 400.

Figure 4:
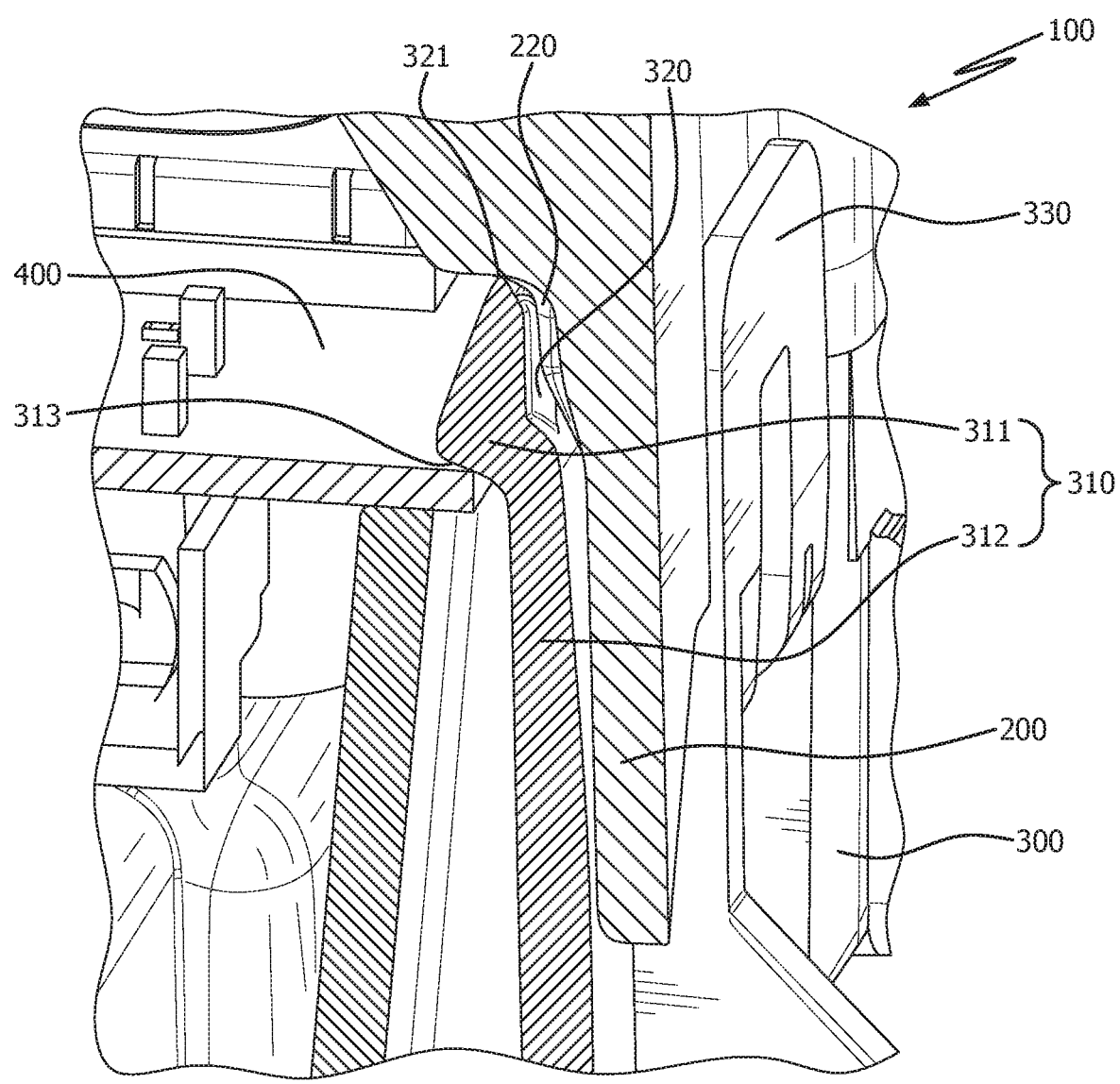
FIG. 4 is an enlarged view of a portion of the housing assembly for securing a printed circuit board from within the assembly, including the bottom housing component, the top housing component, and the printed circuit board in the assembled state.

FIG. 4 illustrates an enlarged view of the housing assembly 100 from within the housing assembly in the coupled state, narrowing in on the area surrounding the flexible snap arm 310 and a corresponding rib 220. Initially, a printed circuit board 400 is coupled with the bottom housing assembly 300 as shown in FIGS. 1A and 1B, wherein the angled lower face portion 313 of the flexible snap arm 310 is in contact with the top surface of the printed circuit board 400, which may help to maintain the printed circuit board 400 within the bottom housing assembly 300 even before the top housing component 200 is coupled in place. In an exemplary embodiment, the point of contact of the printed circuit board 400 with the angled lower face 313 is the edge of the printed circuit board 400.

Upon coupling of the top housing component 200 with the bottom housing component 300 including the printed circuit board 400, the ribs 220 located on the inner surface of the walls of the top housing component 200 exert a horizontal force on the horizontal crush rib 320. The horizontal force may be transferred, at least in part, to the head portion 311 of the flexible snap arm 310 pressing it inward in the corresponding direction of the horizontal force itself. Because the flexible snap arm 310 has an angled lower face 313, the horizontal force exerted on the head portion 311 of the flexible snap arm 310 causes the overhanging portion, which is the head portion 311 including the angled lower face 313, to move forward, climbing further onto the printed circuit board 400. The interference between the flexible snap arm 310 and the printed circuit board 400 will increase, forcing the printed circuit board 400 vertically downwards.

In an embodiment, the angled lower face 313 is fully engaged with the printed circuit board 400, and the printed circuit board cannot be pressed down any further. In this case, any "extra" horizontal force from the rib 220 of the top housing component 200 pressing on the horizontal crush rib 320, that is not being used to further press the printed circuit board 400 vertically downward, may be used to "crush" the horizontal crush rib 320. This "crushing" of the horizontal crush rib 320 by the horizontal force can prevent any excessive forces from being transferred to the printed circuit board 400.

Because the horizontal crush ribs 320 are attached to a vertical edge of the head portion 311, they can take advantage of the flexible nature of the flexible snap arms 310. In an embodiment, the flexible snap arm 310 is relatively more stiff, which may allow for increased "crushing" of the horizontal crush rib 320 as the horizontal forces are applied to the horizontal crush rib 320. In another embodiment, the flexible snap arm 310 is relatively more flexible, which may allow for the head portion 311 of the flexible snap arm 310 to be moved forward to a greater extent than in the previous embodiment as the horizontal forces are applied to the horizontal crush rib 320. This latter embodiment may allow for extra interference to be designed into the housing assembly with less reliance on the actual "crushing" of the horizontal crush ribs 320.

In addition to the horizontal force exerted by the ribs 220 of the top housing component 200, a vertical force is exerted on the vertical crush ribs 321. This vertical force is exerted at least in part by a top surface of the top housing component 200 upon coupling of the top housing component 200 with the bottom housing component 300. Other upward vertical forces, including but not limited to insertion forces from connecting components of the connector 420 to the printed circuit board 400, may exert a vertical force on the vertical crush ribs 321. These vertical forces can "crush" the vertical crush ribs 321.

In an embodiment, the interference generated between the top surface of the top housing component 200 and the vertical crush ribs 321 upon "crushing" can also prevent any failure of the flexible snap arms 310 due to vertical forces, including insertion forces from connecting components of the connector 420. The interference generated can also help to prevent any twisting or lifting in response to a massive amount of force, which could result in breaking of at least a rib 220.

Figure 5:
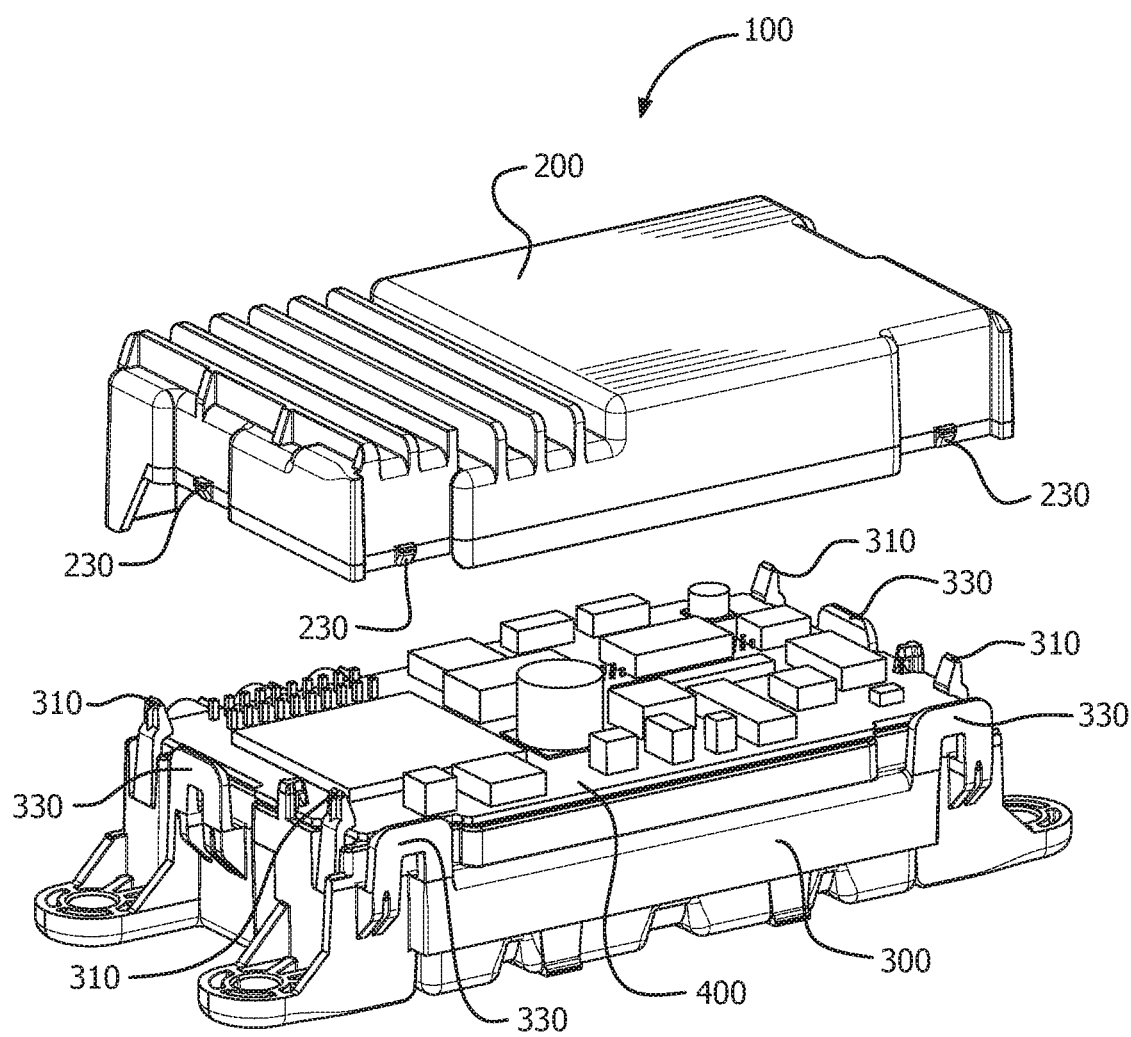
FIG. 5 is a perspective rear view of the housing assembly for securing a printed circuit board, including the bottom housing component assembled with the printed circuit board, and a top housing component positioned above in the unassembled state.
Figure 6:
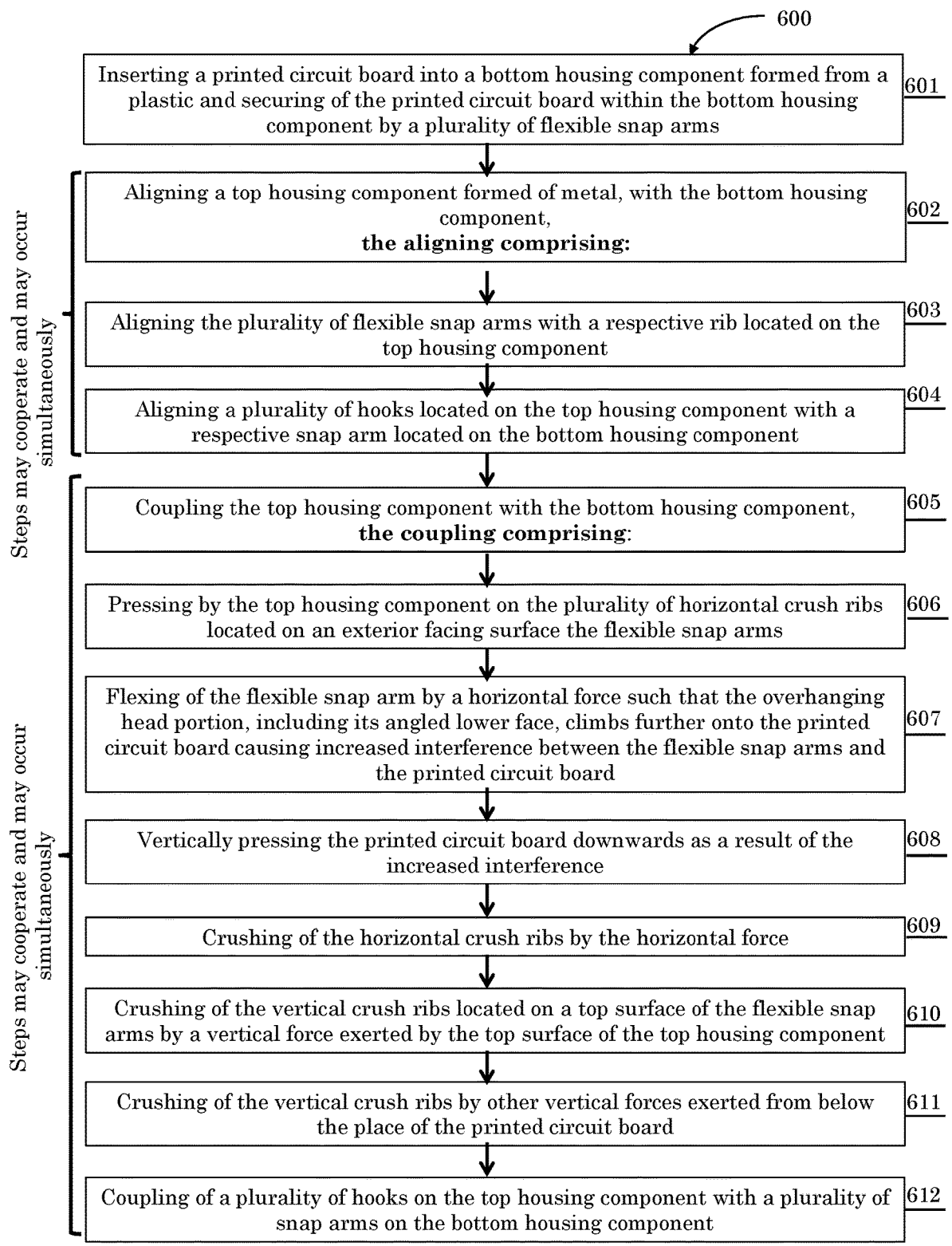
FIG. 6 is a flow chart detailing a method of securing a printed circuit board within a housing assembly comprising a plastic bottom housing component and a metal top housing component.

FIG. 5 illustrates a perspective view of the rear side of the housing assembly 100, wherein the top housing component 200 is positioned above, and not coupled to the bottom housing component 300 and printed circuit board 400. Each of the components represented above in FIG. 1 are illustrated herein.

With regard to the connectors, any type of connector may be used in this assembly 100. Non-limiting examples include board to board connectors and board to cable connectors. In an embodiment, the board to cable connectors could be soldered onto the printed circuit board 400 in their entirety, or just the female portion of the connector could be soldered onto the printed circuit board 400.

This disclosure also represents a method 600 for securing a printed circuit board within the housing assembly disclosed in the foregoing, wherein the bottom housing component is formed of plastic and the top housing component is formed of metal. In some implementations, the steps can be re-arranged or omitted.

A printed circuit board 400 is inserted 601 into a bottom housing component 300 of the housing assembly 100. Upon insertion, the flexible portion of the flexible snap arms 310 flexes to allow the head portion 311 of the flexible snap arms 310 to move back and permit the printed circuit board 400 to be inserted into the bottom housing component 300. Once the printed circuit board 400 is inserted, the flexible portion of the flexible snap arms 310 flexes back in the direction of its original position to allow the head portion to contact a top surface of the printed circuit board 400, securing it within the bottom housing component 300. An angled lower face 313 of the plurality of flexible snap arms 310 rests, or presses on the top surface of the printed circuit board 400 to secure it within the bottom housing component 300.

A top housing component 200 is aligned 602 with the bottom housing component 300. In an embodiment aligning the housing components 200, 300 may include aligning 603 the plurality of flexible snap arms 310, located on the bottom housing component 300, with a corresponding rib 220 of a plurality of ribs 220, located on an inner surface of the top housing component 200. In an embodiment, aligning the housing components 200, 300 may include aligning 604 the plurality of hooks 230 located on an exterior side wall of the top housing component 300 with a corresponding snap arm 330 of a plurality of snap arms 330, located on the bottom housing component 300.

In an embodiment, each of these steps, including aligning 603 of the flexible snap arms 310 with the ribs 220 and aligning 604 the hooks 230 with the snap arms 330 may occur alone or in combination until the housing components 200, 300 are aligned. In an embodiment, each of these steps may occur separately or simultaneously until the housing components 200, 300 are aligned. In another embodiment, any one of such aligning steps 603, 604 may be re-arranged or omitted.

Once the housing components 200, 300 are aligned, they are then coupled together with the printed circuit board 400 in place. Coupling 605 may involve pressing, snapping, or any other action known in the art that may be used to assemble the two housing components 200, 300 together.

In an embodiment, this horizontal force may be transferred, at least in part, to the head portion 311 of the flexible snap arms 310. Flexing 607 of the flexible snap arms occurs such that the head portion 311 is pressed inward in the corresponding direction of the horizontal force itself. Because the flexible snap arms 310 have an angled lower face 313, the horizontal force exerted on the head portion 311 of the flexible snap arms 310 causes the overhanging portion, which is the head portion 311 including the angled lower face 313, to move forward, climbing further onto the printed circuit board 400. The change in height from the angled lower face 313 can create more vertical interference as it slides forward. This increased interference between the flexible snap arms 310 and the printed circuit board 400 may result in pressing 608 of the printed circuit board 400 vertically downwards to secure the printed circuit board 400 vertically.

When the printed circuit board 400 cannot be pressed down any further, any additional horizontal force may be used to "crush" the horizontal crush ribs 320. This "crushing" 609 of the horizontal crush ribs 320 by the horizontal force can prevent any excessive forces from being transferred to the printed circuit board 400.

In an embodiment, where the flexible snap arms 310 are relatively stiff, the "crushing" 609 of the horizontal crush ribs 320 may be greater as the horizontal force is applied than if the flexible snap arms 310 are more flexible.

In another embodiment, where the flexible snap arms 310 are relatively more flexible, the "crushing" 609 of the horizontal crush ribs 320 may be less as the horizontal force is applied than if the flexible snap arms 310 are more stiff. In this embodiment, the head portion 311 of the flexible snap arm 310 may be able to move forward to a greater extent than in the previous embodiment. This could allow for extra interference to be designed into the housing assembly 100 with decreased reliance on the actual "crushing" of the horizontal crush ribs 320.

Upon coupling 605 of the housing components 200, 300, the top surface of the top housing component 200 may exert a vertical force downward on the vertical crush rib 321 "crushing" 610 it. In an embodiment, the ribs 220 may press on the vertical crush ribs 321 as illustrated in at least FIG. 4.

In an embodiment, other vertical forces may exert a vertical force upward on the vertical crush ribs 321 "crushing" 611 it. These upward vertical forces may include, but are not limited to, insertion forces from connecting components of the connector 420 to the printed circuit board 400. These vertical forces can "crush" 611 the vertical crush ribs 321.

Both the downward vertical forces and the upward vertical forces, along with the "crushing" 610, 611 of the vertical crush ribs 321, may help to prevent any upward movement or failure of the flexible snap arms 310 due to vertical forces, including vertical forces generated from insertion of components into the connector 420 of the printed circuit board 400.

In an embodiment, coupling may further comprise coupling 612 of the plurality of hooks 230 with a respective snap arm 330 of the plurality of snap arms 330. The design of the hook 230 and the snap arm 330 may be any design known by one of ordinary skill in the art for coupling two housing components together. In a preferred embodiment, the hooks 230 and the snap arms 330 are represented by those illustrated in the Figures. Other conventional means known in the art can be employed to couple the housing components 200, 300 with one another.

In an embodiment, each of these steps involved in the coupling 605, including pressing 606 of the top housing component 200 on the horizontal crush ribs 320; flexing 607 of the flexible snap arms 310 by a horizontal force causing the angled lower face 313 to climb further onto the printed circuit board 400; vertically pressing 608 the printed circuit board 400 downwards; crushing 609 of the horizontal crush ribs 320; crushing 610 of the vertical crush ribs 321 by a downward vertical force; crushing 611 of the vertical crush ribs 321 by an upward vertical force; and coupling of the hooks 230 with the snap arms 330, may occur simultaneously until the housing components 200, 300 are coupled. In an embodiment, the ribs 220 located on an inner surface of the top housing component 200 may press on the horizontal crush ribs 320 and the vertical crush ribs 321.

In an embodiment, any of these steps involved in coupling 605 may occur simultaneously and cooperate together to further secure the printed circuit board 400 within the housing assembly 100.

In an embodiment, any of these steps involved in the coupling 605 may be re-arranged or omitted.

Although the features and steps are described above in particular combinations and order, one of ordinary skill in the art will appreciate that each feature or step may be re-arranged or omitted.

What is claimed is:

1. A housing assembly for securing a printed circuit board comprising:
    a top housing component formed from a metal;
    a bottom housing component formed from a plastic, the bottom housing component comprising a plurality of flexible snap arms; and
    a printed circuit board residing in the bottom housing component,
    wherein each flexible snap arm of the plurality of flexible snap arms further comprises at least a horizontal crush rib and at least a vertical crush rib, and
    wherein upon coupling of the top housing component with the bottom housing component:
    the top housing component exerts a horizontal force on the at least one horizontal crush rib of each flexible snap arm,
    the top housing component exerts a vertical force downward on the at least one vertical crush rib of each flexible snap arm.

2. The housing assembly for securing a printed circuit board of claim 1 wherein the bottom housing component further comprises at least a snap arm and the top housing component further comprises at least a hook, and a snap arm of the at least a snap arm receives a corresponding hook of the at least a hook upon coupling of the top housing component with the bottom housing component.

3. The housing assembly for securing a printed circuit board of claim 1, wherein the printed circuit board further comprises at least a connector, and the connector is positioned on a bottom surface of the printed circuit board on a side of the housing assembly comprising the bottom housing component.

4. The housing assembly for securing a printed circuit board of claim 1, wherein each flexible snap arm of the plurality of flexible snap arms comprises a head portion, a body portion, and an angled lower face on a bottom surface of the head portion, wherein:
    the angled lower face comprises a lowest portion and a highest portion,
    the lowest portion of the angled lower face is positioned towards the body portion of each respective flexible snap arm,
    the highest portion of the angled lower face is positioned away from the body portion of each respective flexible snap arm, and
    upon coupling of the top housing component with the bottom housing component, the angled lower face climbs further onto the printed circuit board as a result of the horizontal force exerted by the top housing component.

5. The housing assembly for securing a printed circuit board of claim 4, wherein the at least one horizontal crush rib is located along an exterior facing surface of the head portion and the at least one vertical crush rib is located along a top surface of the head portion.

6. The housing assembly for securing a printed circuit board of claim 5, wherein the head portion includes one horizontal crush rib that extends vertically along the exterior facing surface.

7. The housing assembly for securing a printed circuit board of claim 5, wherein the head portion includes one vertical crush rib that extends longitudinally along the top surface.

8. The housing assembly for securing a printed circuit board of claim 1, the top housing component further comprising a plurality of ribs located on an inner side surface.

9. The housing assembly for securing a printed circuit board of claim 8, wherein each rib of the plurality of ribs exerts at least part of the horizontal force on the at least one horizontal crush rib upon coupling of the top housing component with the bottom housing component.

10. The housing assembly for securing a printed circuit board of claim 8, wherein each rib of the plurality of ribs exerts at least part of the vertical force on the at least one vertical crush rib upon coupling of the top housing component with the bottom housing component.

11. A method for securing a printed circuit board, the method comprising:
    inserting the printed circuit board into a bottom housing component that is formed from a plastic, wherein the bottom housing component comprises a plurality of flexible snap arms that secure the printed circuit board to the bottom housing component following insertion of the printed circuit board into the bottom housing component;
    aligning the bottom housing component with a top housing component formed from a metal; and
    coupling the top housing component with the bottom housing component,
    wherein each flexible snap arm of the plurality of flexible snap arms comprises at least one horizontal crush rib and at least one vertical crush rib, and
    wherein upon coupling of the top housing component with the bottom housing component the top housing component exerts a horizontal force on the at least one horizontal crush rib of each flexible snap arm,
    the top housing component exerts a vertical force downward on the at least one vertical crush rib of each flexible snap arm.

12. The method for securing a printed circuit board of claim 11, wherein inserting the printed circuit board further comprises flexing of the flexible snap arms outwards to receive the printed circuit board and flexing of the flexible snap arms inwards following insertion of the printed circuit board.

13. The method for securing a printed circuit board of claim 11, wherein aligning the top housing component with the bottom housing component further comprises aligning a plurality of hooks with a plurality of snap arms, wherein the plurality of hooks are located on at least side wall of the top housing component, and the plurality of snap arms are located on at least a side wall of the bottom housing component.

14. The method for securing a printed circuit board of claim 13, wherein upon coupling of the top housing component with the bottom housing component the plurality of hooks engages with the plurality of snap arms.

15. The method for securing a printed circuit board of claim 11, wherein each flexible snap arm of the plurality of flexible snap arms comprises a head portion located above a plane of the printed circuit board.

16. The method for securing a printed circuit board of claim 15, wherein the head portion further comprises an angled lower face located on a bottom surface of the head portion, wherein upon coupling of the top housing component with the bottom housing component:

the horizontal force exerted by the top housing component on each flexible snap arm flexes the head portion, and the angled lower face climbs further onto the printed circuit board pressing the printed circuit board vertically downwards.

17. The method for securing a printed circuit board of claim 15, the head portion of each flexible snap arm further comprising at least one horizontal crush rib located on an exterior facing surface of the head portion, wherein upon coupling of the top housing component with the bottom housing component the horizontal force exerted by the top housing component on each respective flexible snap arm crushes the at least one horizontal crush rib.

18. The method for securing a printed circuit board of claim 17, the head portion of each flexible snap arm further comprising at least one vertical crush rib located on a top surface of the head portion, wherein upon coupling of the top housing component with the bottom housing component the vertical force downward exerted by the top housing component and a vertical force upward exerted by the printed circuit board crushes the at least one vertical crush rib.

19. The method for securing a printed circuit board of claim 18, wherein the top housing component comprises a plurality of ribs, wherein upon coupling of the top housing component with the bottom housing component:

each rib of the plurality of ribs crushes a corresponding horizontal crush rib using the horizontal force, and each rib of the plurality of ribs crushes a corresponding vertical crush rib using the vertical force.

20. The method for securing a printed circuit board of claim 19, wherein:

aligning the top housing component with the bottom housing component further comprises aligning the plurality of ribs with the plurality of flexible snap arms.

* * * * *